United States Patent
Bergemont et al.

[11] Patent Number: 5,814,856
[45] Date of Patent: Sep. 29, 1998

[54] VARIABLE AND TUNABLE $V_T$ MOSFET WITH POLY AND/OR BURIED DIFFUSION

[75] Inventors: Albert Bergemont; Min-hwa Chi, both of Palo Alto, Calif.

[73] Assignee: National Semiconductor Corporation, Santa Clara, Calif.

[21] Appl. No.: 857,156

[22] Filed: May 15, 1997

[51] Int. Cl.$^6$ .................................................. H01L 29/76
[52] U.S. Cl. ......................... 257/319; 257/320; 257/314; 257/316
[58] Field of Search .................................... 257/300, 310, 257/320, 321, 322; 438/266, 593

[56] References Cited

U.S. PATENT DOCUMENTS

| 4,713,677 | 12/1987 | Tigelaar et al. | 257/322 |
| 5,530,275 | 6/1996 | Widdershoven | 257/300 |

FOREIGN PATENT DOCUMENTS

| 405335506 A | 12/1993 | Japan | 257/315 |
| 406104447 A | 4/1994 | Japan | 257/315 |

OTHER PUBLICATIONS

Shibata, Tadashi et al., "A Functional MOS Transistor Featuring Gate–Level Weighted Sum and Threshold Operations", IEEE Transactions on Electron Devices, vol. 39, No. 6, pp. 1444–1455, Jun. 1992.

Primary Examiner—Tom Thomas
Assistant Examiner—Cuong Nguyen
Attorney, Agent, or Firm—Limbach & Limbach L.L.P.

[57] ABSTRACT

A MOSFET structure that utilizes self-aligned polysilicon and/or buried diffusion lines for coupling capacitors, provides a threshold voltage $V_T$ that is tunable from the control gate from positive (enhancement) to negative (depletion) by applying $V_{cc}$ to the bias gate and carefully designing the coupling ratio of the control gate and the bias gate. This scheme provides multiple $V_T$'s on-chip without process complexity.

1 Claim, 1 Drawing Sheet

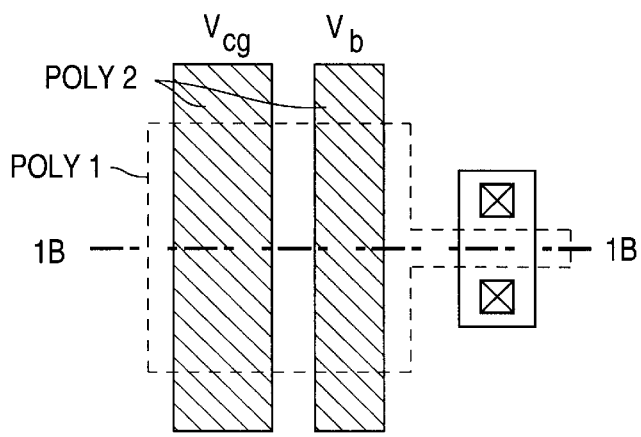
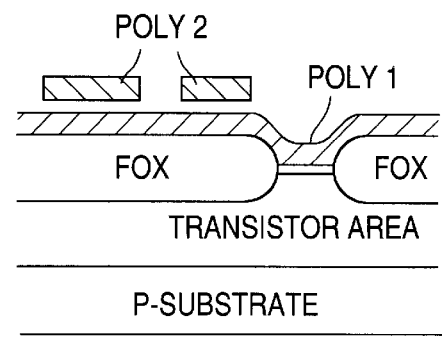
FIG. 1A
(PRIOR ART)
FIG. 1B
(PRIOR ART)
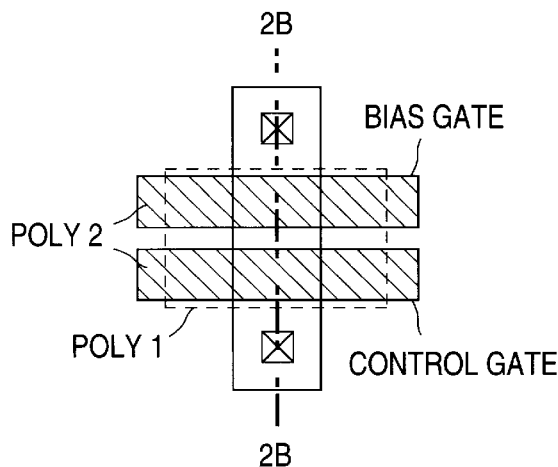
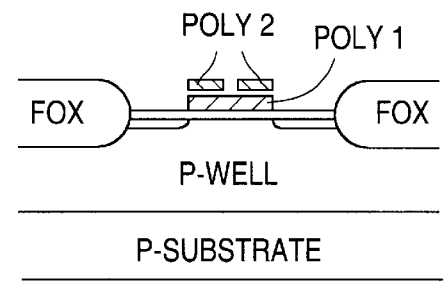
FIG. 2A
FIG. 2B
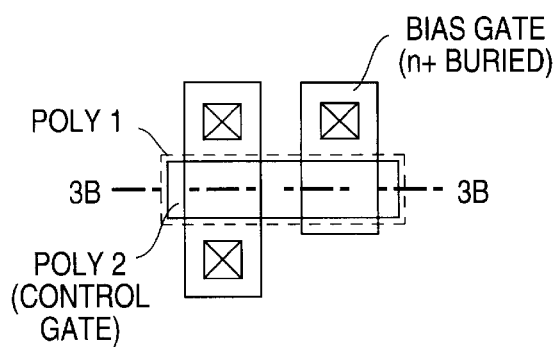
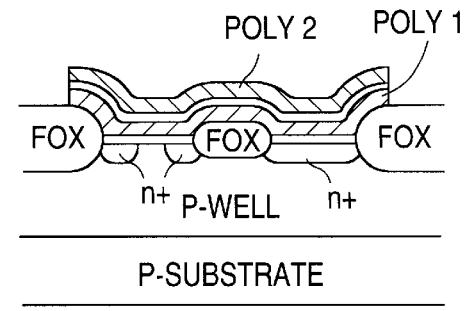
FIG. 3A
FIG. 3B

VARIABLE AND TUNABLE $V_T$ MOSFET WITH POLY AND/OR BURIED DIFFUSION

BACKGROUND OF THE INVENTION

1. Field of the Invention

The present invention relates to integrated circuit element structures and, in particular, to a MOSFET structure with poly and/or buried capacitor coupling so that the threshold voltage $V_T$ of the MOSFET is tunable from the control gate from positive (enhancement) to negative (depletion), thereby providing multiple $V_T$'s on-chip without process complexity.

2. Discussion of the Related Art

T. Shibata and T. Ohmi, "A Functional MOS Transistor Featuring Gate-Level Weighted Sum and Threshold Operations", IEEE Transactions on Electron Devices, V. 39, No. 6, pp. 1444–1455, 1992, disclose a poly-capacitor coupled neuron MOSFET transistor, shown in FIGS. 1A and 1B with two input gates for illustration purposes, that can be used for varying the threshold voltage $V_T$ of a transistor. The potential of the poly-1 floating gate is coupled with two poly-2 gates (a control gate cg and a bias gate b), i.e., $V_{fg} = V_{cg} \cdot \gamma_g + V_b \cdot \gamma_b$, where $\gamma_g$ and $\gamma_b$ are the coupling ratio of the control gate and bias gate, respectively. The transistor is turned on when $V_{fg}$ is above the threshold voltage $V_{to}$, (viewed from the floating-gate). The threshold voltage viewed from the control gate is then, $V_{Tcg} = V_{to}/\gamma_g - V_b \cdot \gamma_b/\gamma_g$. Thus, by applying various bias voltages $V_b$ (typically $V_b = V_{cc}$) and designing various coupling ratios, the threshold $V_{Tg}$ can be varied. For example, if $\gamma_b = 0$ then $V_{Tcg} = V_{to}/\gamma_g$, which may be higher than $V_{to}$. If $\gamma_b = \gamma_g$ and $V_b = V_{cc}$, then $V_{Tcg} = V_{to}/\gamma_g - V_{cc}$, which can be negative (i.e., in depletion). In this way, a wide range of threshold voltages can be designed for various applications.

However, the above structure requires large coupling area on the field oxide for the variable threshold voltage transistors and, therefore, requires greater area.

SUMMARY OF THE INVENTION

The present invention provides a MOSFET structure that utilizes self-aligned polysilicon and/or buried diffusion lines for coupling capacitors. With this structure, the threshold voltage $V_T$ is tunable from the control gate from positive (enhancement) to negative (depletion) by applying $V_{cc}$ to a bias gate and carefully designing the coupling ratio of the control gate and the bias gate. This scheme provides multiple $V_T$'s on-chip without process complexity.

These and other features and advantages of the present invention will be better understood and appreciated upon consideration of the following detailed description and accompanying drawings which set forth illustrative embodiments in which the principles of the invention are utilized.

DESCRIPTION OF THE DRAWINGS

FIGS. 1A and 1B are a layout and a cross-sectional drawing, respectively, illustrating a known variable $V_T$ MOSFET structure.

FIGS. 2A and 2B are a layout and a cross-sectional drawing, respectively, illustrating an embodiment of a variable and tunable $V_T$ MOSFET structure in accordance with the present invention.

FIGS. 3A and 3B are a layout and cross-sectional drawing, respectively, illustrating an alternate embodiment of a variable and tunable $V_T$ MOSFET structure in accordance with the present invention.

DETAILED DESCRIPTION OF THE INVENTION

FIGS. 2A and 2B show a MOSFET structure wherein, in accordance with the present invention, a poly2/poly1 capacitor is fabricated by an EPROM or flash memory process flow, using a self-aligned etch (SAE); that is, the edges of poly-2 control gate and poly-2 bias gate are self-aligned to the underlying poly-1 floating-gate and, therefore, the overall transistor size is minimized. The poly2/poly1 coupling area is on the top of the channel area the field oxide area.

The floating-gate potential is expressed as, $$V_{fg} = V_g \cdot \gamma_g + V_b \cdot \gamma_b.$$

The coupling ratio must take the channel capacitance into consideration. When $V_{fg}$ approaches the threshold voltage ($V_{to}$), the threshold voltage viewed from the control gate ($V_{Tcg}$) is, therefore, $$V_{Tcg} = V_{to}/\gamma_g - V_b \cdot \gamma_b/\gamma_g.$$

properly designing the coupling ratios and applying proper bias (i.e., $V_b = V_{cc}$), the threshold voltage ($V_{Tcg}$) can be varied from $V_{to}/\gamma_g$ (when $V_b = 0$) to $V_{to}/\gamma_g - V_{cc}$ (when $\gamma_b = \gamma_g$ and $V_b = V_{cc}$), as discussed above.

An example of designing a zero $V_t$ MOSFET is briefly discussed below. Assuming $V_{to} = V$, $\gamma_g = 0.5$ and $V_b = 5V$, the condition of $V_{Tcg} = 0$ leads to $\gamma_b = 0.2$. The device size can be determined from the desired $\gamma_g$ and $\gamma_b$, and process parameters (e.g. gate oxide and interpoly oxide thickness).

As shown in FIGS. 3A and 3B, the above structure can be further minimized by using the buried n+ in the MOSFET structure as the bias gate. The control gate contact can be on top of poly-2. The buried n+ can also serve as an interconnect line to other transistors.

If there is charge on the floating-gate, the $V_{Tcg}$ will be different from design. Therefore, wafers from fab before sorting need to be UV erased of process-induced charge. The operating voltage of the resulting MOSFET should be low enough so that low level hot electron injection (i.e., similar to the read disturb in an EPROM) is minimized during the device life.

The n-well to floating gate can also be used as buried coupling capacitor. However, the surface of n-well may be depleted and/or inverted and, hence, the coupling capacitance is reduced. If a buried p+ diffusion inside n-well is fabricated, a negative bias can be used for coupling the floating-gate.

A typical process flow for fabricating structures in accordance with the present invention will now be described. The non-self-aligned neurons can be processed the same as the CMOS structures with capacities, using poly1 for the bottom electrodes and floating gates and poly2 for the top electrodes and control gates. Self-aligned neurons can be processed the same as CMOS flash memory, with an additional self-aligned-etch (SAE) masking step. Two optional masking steps are used to provide buried n+ coupling and self-aligned neurons.

The process flow in accordance with the invention proceeds in the manner at a conventional 0.35 μm CMOS logic process through $V_{TP}$ implant. That is, an initial N-well masking step facilitates N-well implant, followed by growth at pad oxide and an overlying nitride layer. An active area mask is then formed, the nitride etched and field oxide isolation regions are grown. The nitride and pad oxide are then stripped and a layer of sacrificial oxide is grown. A P-field/P-well mask is then defined and P-well and $V_{TN}$ implants are performed. $V_{TP}$ masking and implants steps are then performed.

Next, in an optional step if buried n+ coupling is desired, a buried n+ mask is provided and an arsenic implant is performed to form the n+ buried coupling regions. If buried n+ coupling is not desired, then the above buried n+ masking step and arsenic implant can be skipped. Then a layer of gate oxide about 70 Å thick is grown, followed by poly1 deposition and doping. Next a poly1 mask is formed and the poly1 layer is etched to define neuron bottom electrodes and the floating gates of the CMOS transistors. The poly1 etch is followed by oxide/nitride/oxide (ONO) deposition and poly2 deposition and doping. A poly2 mask is then formed and the poly2 layer is etched to define the neuron gates and to open the CMOS areas.

An optional SAE masking step is then performed for self-aligned neuron gates by plasma etching ONO and then poly1 sequentially as commonly practiced in flash memory fabrication processes. In this case, the outline edge (e.g., FIG. 2A) of the poly2 coupling gates is self-aligned to the underlying poly1 gate, and the overall size of the neuron transistor is minimized compared with the case when a self-aligned process is not used.

The flow then proceeds in accordance with conventional 0.35 μm CMOS logic fabrication techniques.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A variable and tuneable threshold voltage MOSFET structure comprising:

first and second spaced-apart oxide isolation regions formed in a semiconductor substrate to define a substrate region therebetween, the semiconductor substrate having a first conductivity type;

a third oxide isolation formed in the substrate region and spaced-apart from both the first oxide isolation region and the second oxide isolation region to define a device active substrate region between the first and third oxide isolation regions and a coupling substrate region between the second and third oxide isolation regions;

first and second spaced-apart source/drain regions having a second conductivity type opposite the first conductivity type formed in the active substrate region to define a channel region therebetween;

a bias gate region having the second conductivity type formed in the coupling substrate region, the bias gate region connected to receive a bias voltage;

first and second oxide layers formed on the active substrate region and the coupling substrate region, respectively;

a conductive floating gate formed on the first and second oxide layers and to extend over the third oxide isolation region; and a conductive control gate formed over the floating gate and separated from the floating gate by dielectric material, the control gate connected to receive a control voltage.

* * * * *

UNITED STATES PATENT AND TRADEMARK OFFICE
CERTIFICATE OF CORRECTION

PATENT NO. : 5,814,856
DATED : September 29, 1998
INVENTOR(S) : Albert Bergemont et al.

It is certified that error appears in the above-identified patent and that said Letters Patent is hereby corrected as shown below:

On the cover page, at [54] delete "VARIABLE AND TUNABLE $V_T$ MOSFET WITH POLY AND/OR BURIED DIFFUSION" and replace with --VARIABLE AND TUNABLE $V_T$ MOSFET WITH CAPACITOR COUPLING FROM POLY AND/OR BURIED DIFFUSION--.

On the cover page, at [22] delete "May 15, 1997" and replace with --May 16, 1997--.

Signed and Sealed this

Fifteenth Day of February, 2000

Q. TODD DICKINSON

*Attest:*

*Attesting Officer*

*Commissioner of Patents and Trademarks*